United States Patent [19]
Itoh

[11] Patent Number: 5,994,942
[45] Date of Patent: Nov. 30, 1999

[54] BUFFER CIRCUIT WITH WIDE DYNAMIC RANGE

[75] Inventor: Masashi Itoh, Tokyo, Japan

[73] Assignee: Kabushiki Kaisha Toshiba, Japan

[21] Appl. No.: 08/968,064

[22] Filed: Nov. 12, 1997

Related U.S. Application Data

[63] Continuation of application No. 08/773,050, Dec. 24, 1996, abandoned, which is a continuation of application No. 08/515,148, Aug. 15, 1995, abandoned.

[30] Foreign Application Priority Data

Aug. 17, 1994 [JP] Japan .............................. P06-193277

[51] Int. Cl.⁶ .................................................. H03K 5/08
[52] U.S. Cl. ........................... 327/309; 327/74; 327/331; 327/478
[58] Field of Search .................................... 327/316, 108, 327/79, 74, 67, 54, 309, 312, 321, 323, 478, 432

[56] References Cited

U.S. PATENT DOCUMENTS 3,483,425 12/1969 Yanishevsky .
4,382,198 5/1983 Ishijima et al. ............................ 327/14
4,590,394 5/1986 Pace ......................................... 327/309
5,488,322 1/1996 Kaplinsky .................................. 327/74
5,498,990 3/1996 Leung et al. .............................. 327/309

FOREIGN PATENT DOCUMENTS 0 197 704 10/1986 European Pat. Off. .
0 454 253 A1 10/1991 European Pat. Off. .

OTHER PUBLICATIONS

F. Raab, "Average Efficency of Class–G Power Amplifiers," 8087 IEEE Transactions on Consumer Electronics, CE–32, No. 2, May 1986, pp. 145–150.

*Primary Examiner*—Dinh T. Le
*Attorney, Agent, or Firm*—Finnegan, Henderson, Farabow, Garrett & Dunner, L.L.P.

[57] ABSTRACT

A buffer circuit including current sources and switches to connect and disconnect current sources to an output node. The switches are controlled by voltage detectors for comparing an input signal with a reference level. When the reference level is a predetermined value, the amplitude of an output signal swings up to $V_{CC}$ and swings down to $V_{EE}$.

8 Claims, 5 Drawing Sheets

5,994,942

BUFFER CIRCUIT WITH WIDE DYNAMIC RANGE

This application is a continuation of application Ser. No. 08/773,050, filed Dec. 24, 1996, now abandoned, which is a continuation of application Ser. No. 08/515,148, filed Aug. 15, 1995, now abandoned.

FIELD OF THE INVENTION

The present invention generally relates to a buffer circuit, and more particularly, relates to a buffer circuit for receiving an output signal of a 1-bit digital-to-analog converter circuit.

BACKGROUND OF THE INVENTION

A digital-to-analog converter (DAC) is employed to output an analog signal which is directly applicable to analog equipment such as speakers. However to provide an output signal of the DAC to analog equipment, a buffer circuit is required to supply enough electric current drive the equipment.

FIG. 1 shows conventional buffer circuits.

Both of the bases of a first npn-bipolar transistor Q1 and a second pnp-bipolar transistor Q2 are connected to an input node 11. A collector of the first transistor Q1 is connected to a first power supply node 12, and an emitter of the first transistor Q1 is connected to a second power supply node 13 via a first constant current source $I_1$. An emitter of the second transistor Q2 is connected to the first power supply node 12 via a second current source $I_2$, and a collector of the second transistor Q2 is connected to the second power supply node 13.

A base, collector, and emitter of a third npn-bipolar transistor Q3 are connected to the emitter of the second transistor Q2, the node $I_2$, and an output node 14, respectively. A base, collector, and emitter of a fourth pnp-bipolar transistor Q4 are connected to the emitter of the first transistor Q1, the second power supply node $I_3$, and the output node 14, respectively.

FIG. 2 shows a relationship between an input signal $V_{in}$ and output signal $V_{out}$ of the buffer circuit shown in FIG. 1.

First, when a level of the input signal $V_{in}$ is between $V_{BE}$ and $V_{CC}-V_{BE}$ with reference to a ground level (0V), all of the transistors Q1, Q2, Q3, and Q4 are in a conductive state. Therefore, the output signal $V_{out}$ varies linearly in accordance with the input signal $V_{in}$. $V_{CC}$ represents a power supply voltage, and $V_{BE}$ represents a threshold voltage of bipolar transistors.

Second, when the level of the input signal $V_{in}$ is higher than $V_{CC}-V_{BE}$ with reference to the ground level (0V), a voltage across the base and emitter of the second transistor Q2 is lower than the threshold voltage $V_{BE}$, and the second transistor Q2 is in a non-conductive state. Therefore, current of the second constant current source $I_2$ flows into the base of the third transistor Q3, and the third transistor Q3 remains in the conductive state. A voltage across the base and emitter of the fourth transistor Q4 is lower than the threshold voltage $V_{BE}$, and the fourth transistor Q4 is in a non-conductive state. Therefore, the output signal $V_{out}$ is clipped at a level of $V_{CC}-V_{BE}$.

Finally, when the level of the input signal $V_{in}$ is lower than $V_{BE}$ with reference to a ground level (0V), a voltage across the base and emitter of the first transistor Q1 is lower than the threshold voltage $V_{BE}$, and the first transistor Q1 is in a non-conductive state. Therefore, all the current of the first constant current source $I_1$ flows into the base of the fourth transistor Q4, and the fourth transistor Q4 remains in the conductive state. A voltage across the base and emitter of the third transistor Q3 is lower than the threshold voltage $V_{BE}$, and the third transistor Q3 is in the non-conductive state. Therefore, the output signal $V_{out}$ is clipped at a level of $V_{BE}$.

In the conventional buffer circuit, as described above, when the level of the input signal $V_{in}$ is lower than the threshold voltage $V_{BE}$, the output signal $V_{out}$ is clipped at the level of $V_{BE}$, and when the level of the input signal $V_{in}$ is higher than $V_{CC}-V_{BE}$, the output signal $V_{out}$ is clipped at the level of $V_{CC}-V_{BE}$. Namely, a dynamic range of the output signal is $|V_{CC}-2\times V_{BE}|$.

It is well known that the typical value for $V_{BE}$ of a bipolar transistor is 0.7V. Therefore, if the power supply voltage $V_{CC}$ is 3V, the dynamic range of the output signal is 1.6V (=3V–2×0.7V).

The narrow dynamic range leads to a distortion in the output signal. The distortion may be eliminated by attenuating the input signal. However, attenuating the input signal leads to deterioration in signal-to-noise (S/N) ratio. These problems are serious in low-supply-voltage circuits.

SUMMARY OF THE INVENTION

It is an object of the invention to provide an improved buffer circuit that is not subject to the above described problems and disadvantages.

It is an additional object of the present invention to provide an improved buffer circuit wherein the dynamic ranges of the input and output signal are the same as the supply voltage.

In accordance with the present invention, the foregoing objects, among others, are achieved by providing a buffer circuit comprising an input node, an output node, an output stage coupled to the output node, first and second switch circuits coupled to the output node, a first current source coupled to the first switch circuit, and a second current source coupled to the second switch circuit. The second current source is coupled to a first power supply node, and the first current source is coupled to a second power supply node. The buffer circuit further comprises a first level detector including a first reference level generator and a first switch controller, the first reference level generator generating a first reference level; and a second level detector including a second reference level generator and a second switch controller, the second reference level generator generating a second reference level. Wherein, when a voltage level of the input node is lower than the first reference level, the first level detector controls the first switch circuit so as to couple the first current source to the output node, and when the voltage level of the input node is higher than the second reference level, the second level detector controls the second switch circuit so as to couple the second current source to the output node.

In accordance with another aspect of the present invention, the above stated objects are achieved by providing a buffer circuit comprising a first transistor having a first base, a first collector, and a first emitter, the first base being coupled to an input node and the first collector being coupled to a first power supply node; a second transistor having a second base, a second collector, and a second emitter, the second base being coupled to a first reference level generator, the second collector being coupled to an output node, and the second emitter being coupled to the first base, with the first and second transistors constituting a first differential amplifier; a third transistor having a third base, a third collector, and a third emitter, the third base being coupled to the input node and the third collector being coupled to a second power supply node; a fourth transistor having a fourth base, a fourth collector, and a fourth emitter, the fourth base being coupled to a second reference level generator, the fourth collector being coupled to the output node, and the fourth emitter being coupled to the third base, with the third and fourth transistors constituting a second differential amplifier; a first constant current source coupled between the first and second emitters and the second power supply node; a second constant current source coupled between the third and fourth emitters and the first power supply node; a fifth transistor having a fifth base, a fifth collector, and a fifth emitter, the fifth base being coupled to the third and fourth emitters, the fifth collector being coupled to the first power supply node, and the fifth emitter coupled to the output node; and a sixth transistor having a sixth base, a sixth collector, and a sixth emitter, the sixth base being coupled to the first and second emitters, the sixth collector being coupled to the second power supply node, and the sixth emitter being coupled to the output node.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DESCRIPTION OF PREFERRED EMBODIMENTS

Embodiments of the present invention will be described in detail with reference to the drawings.

Figure 1:
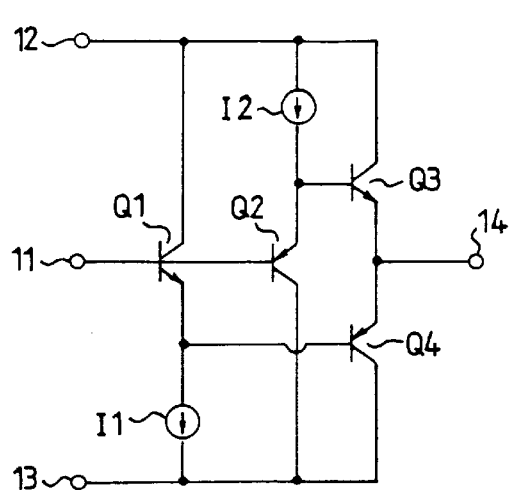
FIG. 1 is a block diagram of a conventional buffer circuit.
Figure 2:
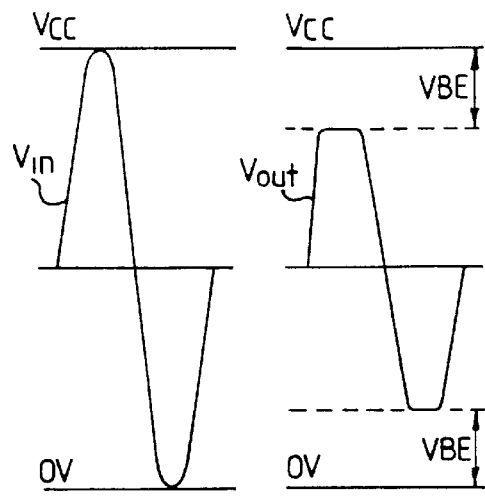
FIG. 2 is a waveform chart showing the input and output signals of the conventional buffer circuit shown in FIG. 1.
Figure 3:
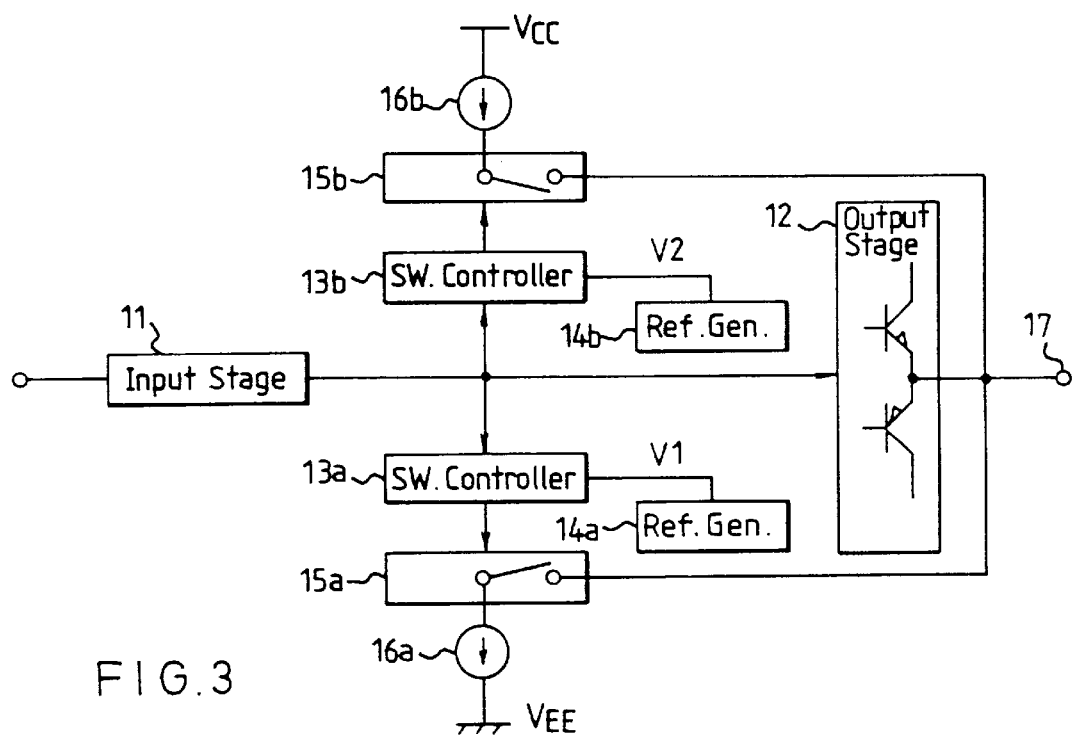
FIG. 3 is a block diagram of a buffer circuit according to the present invention.

Referring now to FIGS. 1 and 2, the abstract idea of the present invention will be explained. FIG. 3 is a block diagram of a buffer circuit according to the present invention.

The input signal $V_{in}$ is input to an input stage 11, and an output signal is output from an output stage 12. The input stage 11 may be a node for receiving a signal, and the output stage 12 may be for example, a single ended push-pull (SEPP) circuit. A first level detector includes a first switch controller 13a, which controls a switch circuit 15a, and a first reference level generator 14a. The switch circuit 15a connects or disconnects a first current source 16a and an output node 17. A second level detector includes a second switch controller 13b, which controls a switch circuit 15b, and a second reference level generator 14b. The switch circuit 15b connects or disconnects a second current source 16b and the output node 17.

When the level of the input signal is lower than a first reference level $V_1$, generated by the first reference level generator 14a, the first switch controller 13a controls the first switch circuit 15a to connect the first current source 16a to the output node 17. When the level of the input signal is higher than a second reference level $V_2$, generated by the second reference level generator 14b, the second switch controller 13b controls the second switch circuit 15b to connect the second current source 16b to the output node 17.

With this configuration, the buffer circuit can be operable at a low power supply voltage, and the dynamic range of the input and output signals are equal to the supply voltage. Moreover, if the reference levels of the reference level generators 14a and 14b vary, the dynamic range of the output signal varies in accordance with the reference levels.

Figure 4:
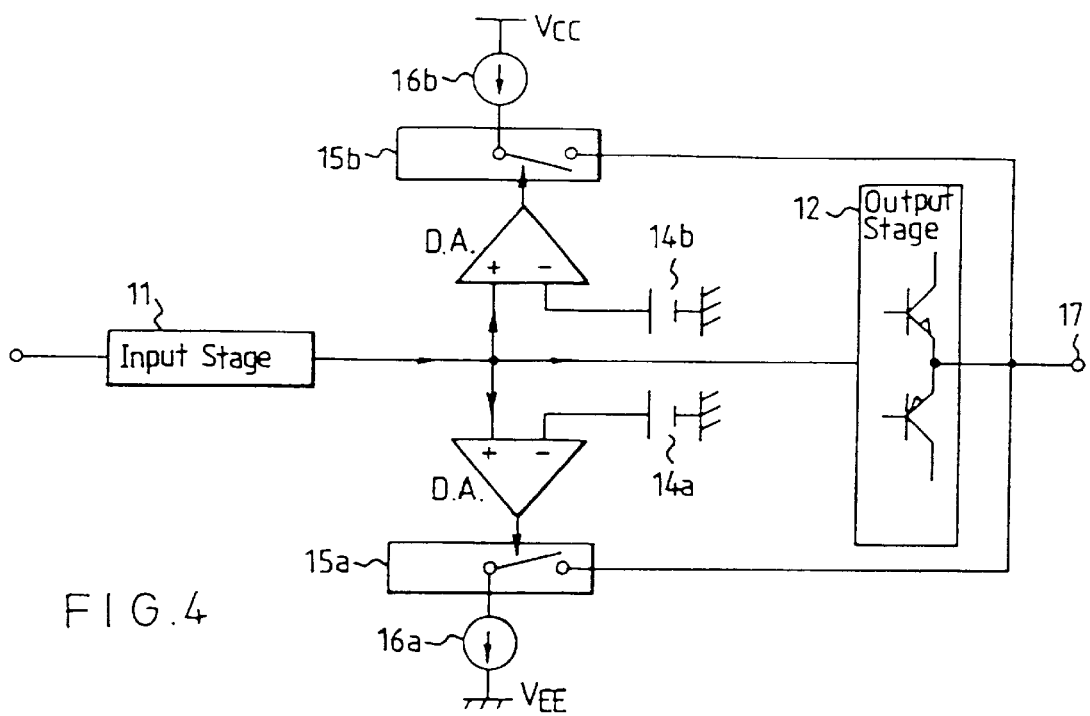
FIG. 4 is a block diagram showing details of the block diagram in FIG. 3.

In FIG. 4, the first and second level detectors are shown in detail. Each switch controller includes a differential amplifier D.A., and the reference level generators include a constant voltage source, respectively.

The first embodiment of the present invention will be explained with reference to FIG. 5.

A first npn-bipolar transistor Q11 and a second npn-bipolar transistor Q12 form a first differential amplifier. A base, collector, and emitter of the first transistor Q11 are connected to the input node 11, a first power supply node 12, and a second power supply node 13 via the first constant current source $I_1$, respectively. A level of the first power supply node is a predetermined positive value, and a level of the second power supply node is a ground level.

A base, collector, and emitter of the second transistor Q12 are connected to the first level generator 15, the output node 14, and the second power supply node 13 via the first constant current source $I_1$, respectively.

A third pnp-bipolar transistor Q13 and a fourth pnp-bipolar transistor Q14 form a second differential amplifier. A base, collector, and emitter of the third transistor Q13 are connected to the input node 11, the second power supply node 13, and the first power supply node 12 via the second constant current source $I_2$, respectively.

A base, collector, and emitter of the fourth transistor Q14 are connected to the second level generator 16, the output node 14, and the first power supply node 12 via the second constant current source $I_2$, respectively.

The first reference level generator 15 applies the first reference level $V_1$ across the base of the second transistor Q12 and the second power supply node 13, and the second reference level generator 16 applies the second reference level $V_2$ across the base of the fourth transistor Q14 and the first power supply node 12. Namely, a voltage level of the base of the second transistor Q12 is $V_1$, (where $V_{EE}=0$), and a voltage level of the base of the fourth transistor Q14 is $V_{CC}-V_2$.

The amplitude of the swing of the output signal $V_{out}$ is determined by the levels $V_1$ and $V_2$ of the first and second reference level generators 15 and 16.

A base, collector, and emitter of a fifth npn-bipolar transistor Q15 are connected to the emitters of the third and fourth transistors Q13 and Q14, the first power supply node 12, and the output node 14, respectively.

A base, collector, and emitter of a sixth pnp-bipolar transistor Q16 are connected to the emitters of the first and second transistors Q11 and Q12, the second power supply node 13, and the output node 14, respectively.

Figure 5:
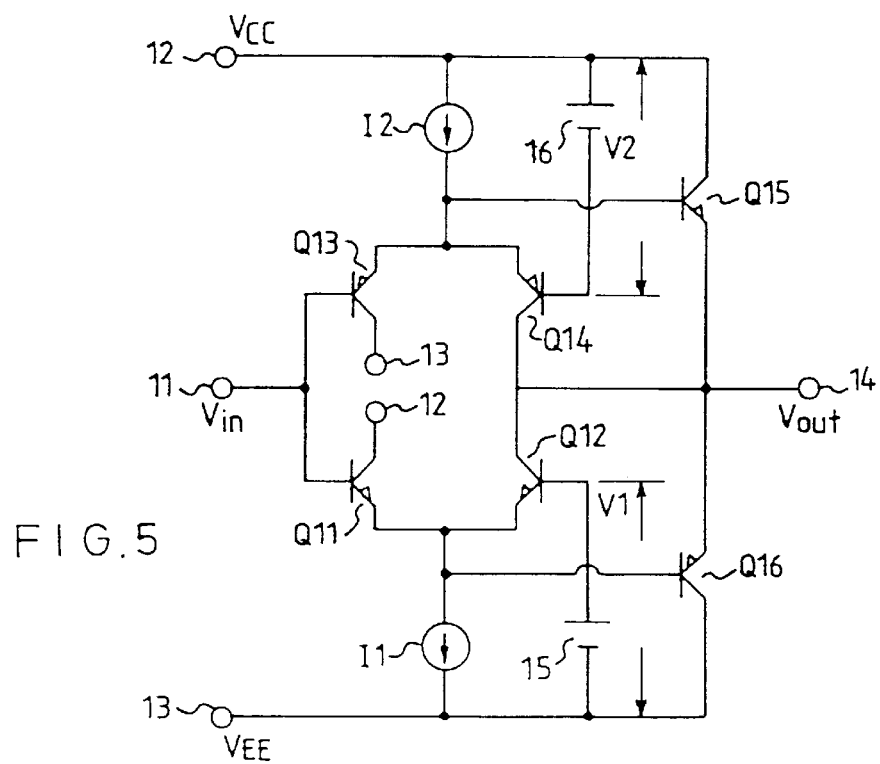
FIG. 5 is a block diagram of a buffer circuit according to a first embodiment of the present invention.
Figure 6:
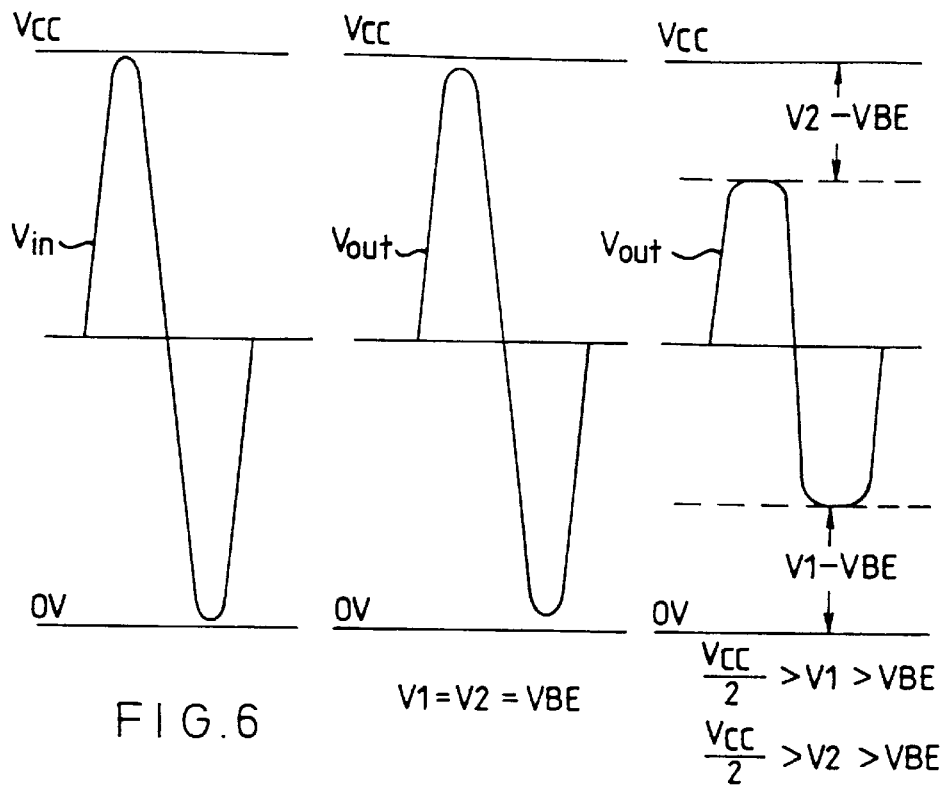
FIG. 6 is a waveform chart showing the input and output signals of the buffer circuit shown in FIG. 5.

FIG. 6 shows a relationship between the input signal $V_{in}$ and output signal $V_{out}$ of the buffer circuit shown in FIG. 5.

Note that the level $V_{CC}$ of the first power supply node 12 is a predetermined positive value, and the level $V_{EE}$ of the second power supply node 13 is the ground level. Suppose that the levels $V_1$ and $V_2$ satisfy the following equations (1) and (2), respectively.

$$(V_{CC}/2) > V_1 \geq V_{BE} \quad (1)$$

$$(V_{CC}/2) > V_2 \geq V_{BE} \quad (2)$$

First, suppose that the level $V_{in}$ of the input signal is higher than the ground level (0V) and is lower than the level $V_1$ at the base of the second transistor Q12. (namely, $V_1 > Vin > 0$)

Under this condition, of the two transistors constituting the first differential amplifier, the first transistor Q11 is in a non-conductive state, and the second transistor Q12 is in a conductive state. Of the two transistors constituting the second differential amplifier, the third transistor Q13 is in a conductive state, and the fourth transistor Q14 is in a non-conductive state.

Consequently, the current driven by the first constant current source $I_1$ flows from the first power supply node 12 into the second power supply node 13 via the fifth and second transistors Q15 and Q12. Therefore, an instant level of the input signal $V_{in}$ is output as the output signal $V_{out}$ via the third and fifth transistors Q13 and Q15 because the fifth transistor Q15 forms an emitter follower to the third transistor Q13.

Here, the level of the output signal $V_{out}$ from the output node 14 may decrease until the second transistor Q12 is saturated by the fifth transistor Q15. Namely, the minimum level $V_{out(min)}$ of the output signal is represented as follows.

$$V_{out(min)} = V_1 - V_{BE} \quad (3)$$

(Where the saturation voltage $V_{CE(sat)}$ of the second transistor Q12 is zero volt.)

In equation (3), when $V_1$ is equal to $V_{BE}$, $V_{out(min)}$ is equal to zero (0V), the output signal $V_{out}$ swings down to the ground level (0V). However, when $V_1$ is lower than $V_{BE}$, the output signal $V_{out}$ does not swing down to the ground level because the second transistor Q12 never turns on.

When $V_1$ is equal to or higher than $(V_{CC}/2)$ and $V_2$ is lower than $(V_{CC}/2)$, the input signal is transferred to the output node 14 via the third and fifth transistors Q13 and Q15 because the first transistor Q11 never turns on.

(b)
When the level $V_{in}$ of the input signal is higher than the level $V_1$ of the base of the second transistor Q12 and is lower than the level $V_{CC} - V_2$ at the base of the fourth transistor Q14. (namely, $V_{CC} - V_2 > Vin > V_1$)

Of the two transistors constituting the first differential amplifier, the first transistor Q11 is in a conductive state, and the second transistor Q12 is in a non-conductive state. Of the two transistors constituting the second differential amplifier, the third transistor Q13 is in a conductive state, and the fourth transistor Q14 is in a non-conductive state.

Consequently, the fifth and sixth transistors Q15 and Q16 are in a conductive state to form the single ended push-pull circuit. Therefore, the instant level of the input signal $V_{in}$ is output as the output signal $V_{out}$ via the first, sixth, third, and fifth transistors Q11, Q16, Q13, and Q5.

(c)
Finally, when the level $V_{in}$ of the input signal is higher than the level $V_{CC} - V_2$ of the base of the fourth transistor Q14 and is lower than the level $V_{CC}$ at the first power supply node 12. (namely, $V_{CC} > Vin > V_{CC} - V_2$)

Of the two transistors constituting the first differential amplifier, the first transistor Q11 is in a conductive state, and the second transistor Q12 is in a non-conductive state. Of the two transistors constituting the second differential amplifier, the third transistor Q13 is in a non-conductive state, and the fourth transistor Q14 is in a conductive state.

Consequently, the current driven by the second constant current source $I_2$ flows from the first power supply node 12 into the second power supply node 13 via the fourth and sixth transistors Q14 and Q16. Therefore, the instant level of the input signal $V_{in}$ is output as the output signal $V_{out}$ via the first and sixth transistors Q11 and Q16 because the sixth transistor Q16 forms an emitter follower to the first transistor Q11.

Here, the level of the output signal Vout from the output node 14 may increase until the fourth transistor Q14 is saturated by the sixth transistor Q16. Namely, the maximum level $V_{out(max)}$ of the output signal is represented as follows.

$$V_{out(max)} = V_{CC} - V_2 + V_{BE} \quad (4)$$

(Where that the saturation voltage $V_{CE(sat)}$ of the fourth transistor Q14 is zero)

In equation (4), when $V_2$ is equal to $V_{BE}$, $V_{out(max)}$ is equal to $V_{CC}$, and therefore, the output signal $V_{out}$ swings up to the power supply voltage $V_{CC}$. However, when $V_2$ is lower than $V_{BE}$, the output signal $V_{out}$ does not swing up to the power supply voltage $V_{CC}$ because the fourth transistor Q14 never turns on.

When $|V_2|$ is equal to or larger than $|V_{CC}/2|$ and $|V_1|$ is smaller than $|V_{CC}/2|$, the input signal is transferred to the output node 14 via the first and sixth transistors Q11 and Q16 because the third transistor Q13 never turns on.

Particularly, when $V_1$ is equal to or higher than $(V_{CC}/2) + V_{BE}$ and $V_2$ is equal to or higher than $(V_{CC}/2) + V_{BE}$, the input signal is not transferred to the output node 14.

With this configuration, the buffer circuit can be operable at a low power supply voltage, and the dynamic range of the input and output signals are equal to the supply voltage. Moreover, if the reference levels generated by the reference level generators vary, the dynamic range of the output signal varies in accordance with the reference levels. Namely, the amplitude of the swing of the output signal may be selected to be an arbitrary value. When the level of the first power supply node 12 is $V_{CC}$ and the level of the second power supply node 13 is zero (0V), the widest dynamic range $(|V_{CC}|)$ is available with $V_1$ and $V_2$ being $V_{BE}$, the narrowest dynamic range (0) is available with $V_1$ and $V_2$ being $(V_{CC}/2) + V_{BE}$.

Next, the second embodiment of the present invention will be explained with reference to FIG. 7.

Figure 7:
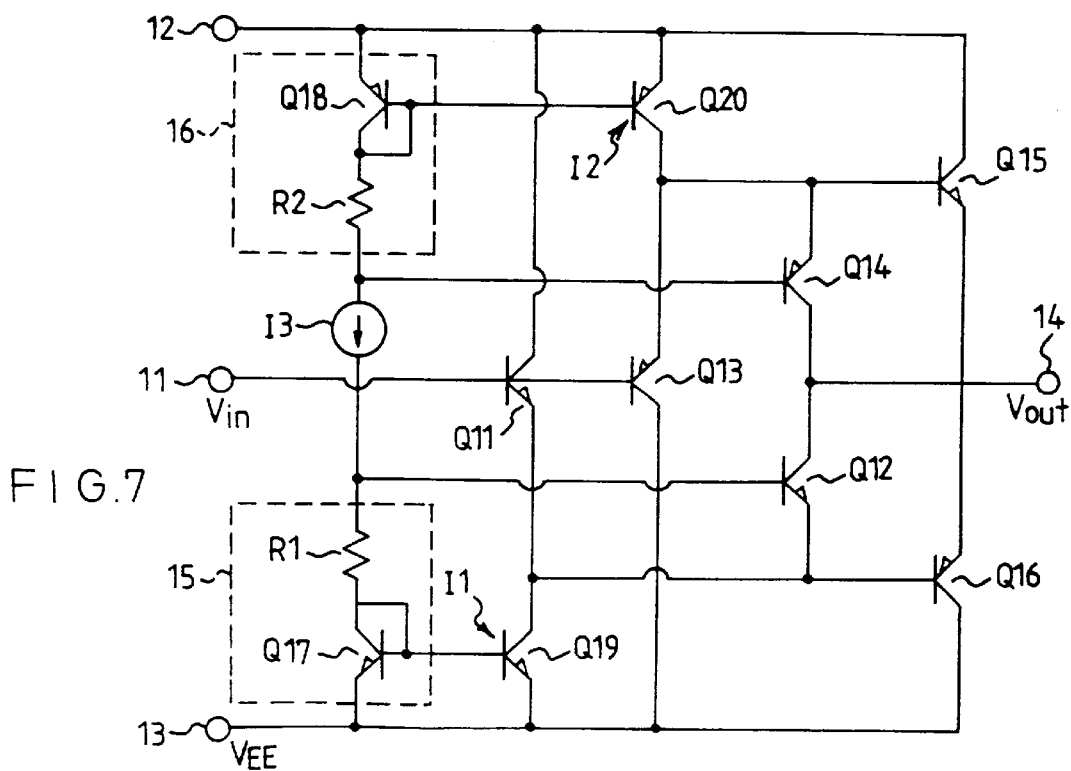
FIG. 7 a block diagram of a buffer circuit according to a second embodiment of the present invention.

The buffer circuit shown in FIG. 7 is characterized by configurations of reference level generators 15 and 16, and the constant current sources $I_1$ and $I_2$. A seventh npn-bipolar transistor Q17 and a first resistor $R_1$ form the first reference level generator 15, and an eighth pnp-bipolar transistor Q18 and a second resistor $R_2$ form the second reference level generator 16. A ninth npn-bipolar transistor Q19 forms the first constant current source $I_1$, and a tenth pnp-bipolar transistor Q20 forms the second constant current source $I_2$.

The configuration of the buffer circuit according to the second embodiment will be explained in detail below.

First and second transistors Q11 and Q12 form the first differential amplifier. The base, collector, and emitter of the first transistor Q11 are connected to the input node 11, the first power supply node 12, and a collector of the ninth transistor Q19 constituting the first constant current source $I_1$, respectively. An emitter of the ninth transistor Q19 is connected to the second power supply node 13, which level is the ground level.

The base, collector, and emitter of the second transistor Q12 are connected to one node of the first resistor $R_1$ constituting the first level generator 15, the output node 14, and the collector of the ninth transistor Q19, constituting the first constant current source $I_1$, respectively. The other node of the first resistor $R_1$ is connected to a base and collector of the seventh transistor Q17. An emitter and the base of the seventh transistor are connected to the second power supply node 13 and a base of the ninth transistor Q19, respectively.

The third and fourth transistors Q13 and Q14 form the second differential amplifier. A base, collector, and emitter of the third transistor Q13 are connected to the input node 11, the second power supply node 13, and a collector of the tenth transistor Q20, constituting the second constant current source $I_2$, respectively.

A base, collector, and emitter of the fourth transistor Q14 are connected to one node of the second resistor $R_2$, constituting the second reference level generator 16, the output node 14, and the collector of the tenth transistor Q20 constituting the second constant current source $I_2$, respectively. The other node of the resistor $R_2$ is connected to a base and collector of the eighth transistor Q18. An emitter and the base of the eighth transistor Q18 are connected to the first power supply node 12 and a base of the tenth transistor Q20, respectively.

A third constant current source $I_3$ is connected between a node of the first resistor $R_1$ and a node of the second resistor $R_2$. A base, collector, and emitter of the fifth transistor Q15 are connected to the emitters of the third and fourth transistors Q13 and Q14, the first power supply node 12, and the output node 14, respectively. A base, collector, and emitter of the sixth transistor Q16 are connected to the emitters of the first and second transistors Q11 and Q12, the second power supply node 13, and the output node 14, respectively.

An emitter of the tenth transistor Q20 is connected to the first power supply node 12.

In the above mentioned buffer circuit, suppose that the constant current generated by the third constant current source is $I_3$, resistances of the first and second resistors are $R_1$ and $R_2$, and a voltage across the base and emitter of the transistors Q17 and Q18 is $V_{BE}$, voltages applied to the base of the second and fourth transistors Q12 and Q14 are $V_{BE}+I_3 \times R_1$ and $V_{CC}-(V_{BE}+I_3 \times R_2)$, respectively. Namely, $V_1$ and $V_2$ are represented as follows.

$$V_1 = V_{BE} + I_3 \times R_1$$

$$V_2 = V_{BE} + I_3 \times R_2$$

The first resistor $R_1$ is provided to prevent the first constant current source, or ninth transistor Q19, from saturating, and the second resistor $R_2$ is provided to prevent the second constant current source, or tenth transistor Q20, from saturating.

In this embodiment, the third constant current source $I_3$ is provided to drive the first and second reference level generators 15 and 16. Further, the first and second constant current sources $I_1$ and $I_2$ are also driven by the third constant current source $I_3$.

With this configuration, the buffer circuit can be operable at a low power supply voltage, and the dynamic range of the input and output signals are equal to the supply voltage. Moreover, if the reference levels by the reference level generators 15 and 16 vary, the dynamic range of the output signal varies in accordance with the reference levels. Namely, the amplitude of the swing of the output signal may be selected to an arbitrary value. When the level of the first power supply node 12 is $V_{CC}$ and the level of the second power supply node 13 is zero (0V), the widest dynamic range ($|V_{CC}|$) is available with $V_1$ and $V_2$ being $V_{BE}$, the narrowest dynamic range (0) is available with $V_1$ and $V_2$ being $(V_{CC}/2)+V_{BE}$.

Next, the third embodiment of the present invention will be explained with reference to FIG. 8.

Figure 8:
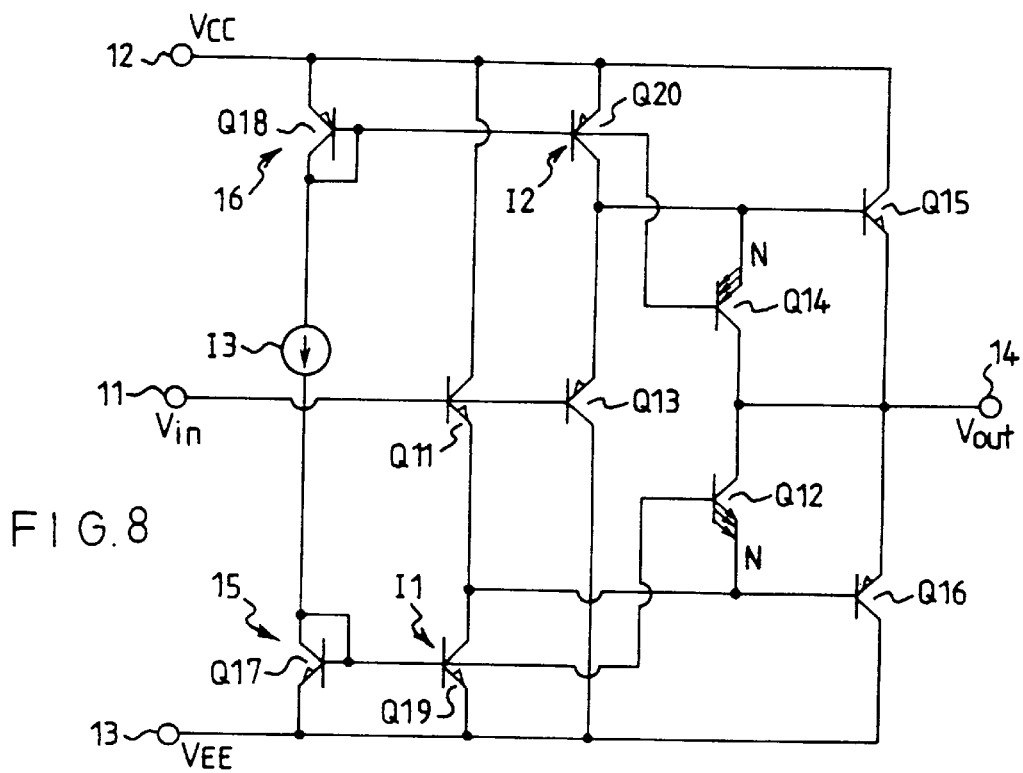
FIG. 8 is a block diagram of a buffer circuit according to a third embodiment of the present invention.

The buffer circuit shown in FIG. 8 is characterized by configurations of the reference level generators 15 and 16, and the constant current sources $I_1$ and $I_2$. The seventh npn-bipolar transistor Q17 forms the first reference level generator 15, and the eighth pnp-bipolar transistor Q18 forms the second reference level generator 16. The ninth npn-bipolar transistor Q19 forms the first constant current source $I_1$, and the tenth pnp-bipolar transistor Q20 forms the second constant current source $I_2$. Each emitter area of the second and fourth transistors Q12 and Q14 is N-times larger than that of the transistors $Q_{19}$ and $Q_{20}$.

The configuration of the buffer circuit according to this embodiment will be explained in detail.

All of the first, second, fifth, seventh, and ninth transistors are npn-bipolar transistors, and all of the third, fourth, sixth, eighth, and tenth transistors are pnp-bipolar transistors.

The first and second transistors Q11 and Q12 form the first differential amplifier. A base, collector, and emitter of the first transistor Q11 are connected to the input node 11, the first power supply node 12, and a collector of the ninth transistor Q19 constituting the first constant current source $I_1$, respectively. An emitter of the ninth transistor Q19 is connected to the second power supply node 13 whose level is the ground level.

The base, collector, and emitter of the second transistor Q12 are connected to the base and collector of the seventh transistor $Q_{17}$ constituting the first level generator 15, the output node 14, and the collector of the ninth transistor Q19, respectively. An emitter and base of the seventh transistor Q17 are connected to the second power supply node 13 and a base of the ninth transistor Q19, respectively.

The third and fourth transistors Q13 and Q14 form the second differential amplifier. A base, collector, and emitter of the third transistor Q13 are connected to the input node 11, the second power supply node 13, and a collector of the tenth transistor Q20 constituting the second constant current source $I_2$, respectively. An emitter of the tenth transistor 20 is connected to the first power supply node 12.

A base, collector, and emitter of the fourth transistor Q14 are connected to a base and collector of the eighth transistor Q18 constituting the second reference level generator 16, the output node 14, and the collector of the tenth transistor Q20, respectively. The emitter and the base of the eighth transistor Q18 are connected to the first power supply node 12 and a base of the tenth transistor Q20, respectively.

The third constant current source $I_3$ is connected between collectors of the seventh and eighth transistors. A base, collector, and emitter of the fifth transistor Q15 are connected to the emitters of the third and fourth transistors Q13 and Q14, the first power supply node 12, and the output node 14, respectively. A base, collector, and emitter of the sixth transistor Q16 are connected to the emitters of the first and second transistors Q11 and Q12, the second power supply node 13, and the output node 14, respectively.

In the above mentioned buffer circuit, when the constant current driven by the third constant current source is $I_3$, voltages across the base and emitter of the transistors Q17 and Q18 are $V_{BE}$, and voltages applied to the base of the second and fourth transistors Q12 and Q14 are $V_{BE}$ and $V_{CC}-V_{BE}$, respectively, $V_1$ and $V_2$ are represented as follows.

$$V_1 = V_{BE}$$

$$V_2 = V_{BE}$$

Therefore, the dynamic range of the output signal Vout is equal to $|V_{CC}|$.

An emitter area of the second transistor Q12 is N-times larger than that of the ninth transistor Q19 to prevent the first constant current source $I_1$, or the ninth transistor Q19, from saturating. An emitter area of the fourth transistor Q14 is N-times larger than that of the tenth transistor Q20 to prevent the second constant current source $I_2$, or the tenth transistor Q20 from saturating. A drop in $V_{BE}$, or $\Delta V_{BE}$, is represented as follows.

$$\Delta V_{BE} \text{ (mV)} = V_T \times \ln N$$

($V_T$: thermal voltage of the transistor, 26 mV)

For example, when a number "N" is 4, a voltage across the base and the emitter of the second transistor Q12 ($V_{BE(Q12)}$) is lower than that of the ninth transistor Q19 ($V_{BE(Q19)}$) by 36 mV. When a number "N" is 8, $V_{BE(Q12)}$ is lower than $V_{BE(Q19)}$ by 54 mV. Namely, the threshold voltages of the second and fourth transistors Q12 and Q14 are lower than those of the ninth and tenth transistors Q19 and Q20.

In this embodiment, the third constant current source $I_3$ is provided to drive the first and second reference level generators 15 and 16. Further, the first and second constant current sources $I_1$ and $I_2$ are driven by the third constant current source $I_3$.

With this configuration, the buffer circuit can be operable at a low power supply voltage, and the dynamic range of the input and output signals are equal to the supply voltage. Moreover, if the reference levels by the reference level generators 15 and 16 vary, the dynamic range of the output signal varies in accordance with the reference levels. Namely, the amplitude of the swing of the output signal may be selected to be an arbitrary value. When the level of the first power supply node 12 is $V_{CC}$ and the level of the second power supply node 13 is zero (0V), the widest dynamic range ($|V_{CC}|$) is available with $V_1$ and $V_2$ being $V_{BE}$, and the narrowest dynamic range (0) is available with $V_1$ and $V_2$ being $(V_{CC}/2)+V_{BE}$.

Next, the fourth embodiment of the present invention will be explained with reference to FIG. 9.

Figure 9:
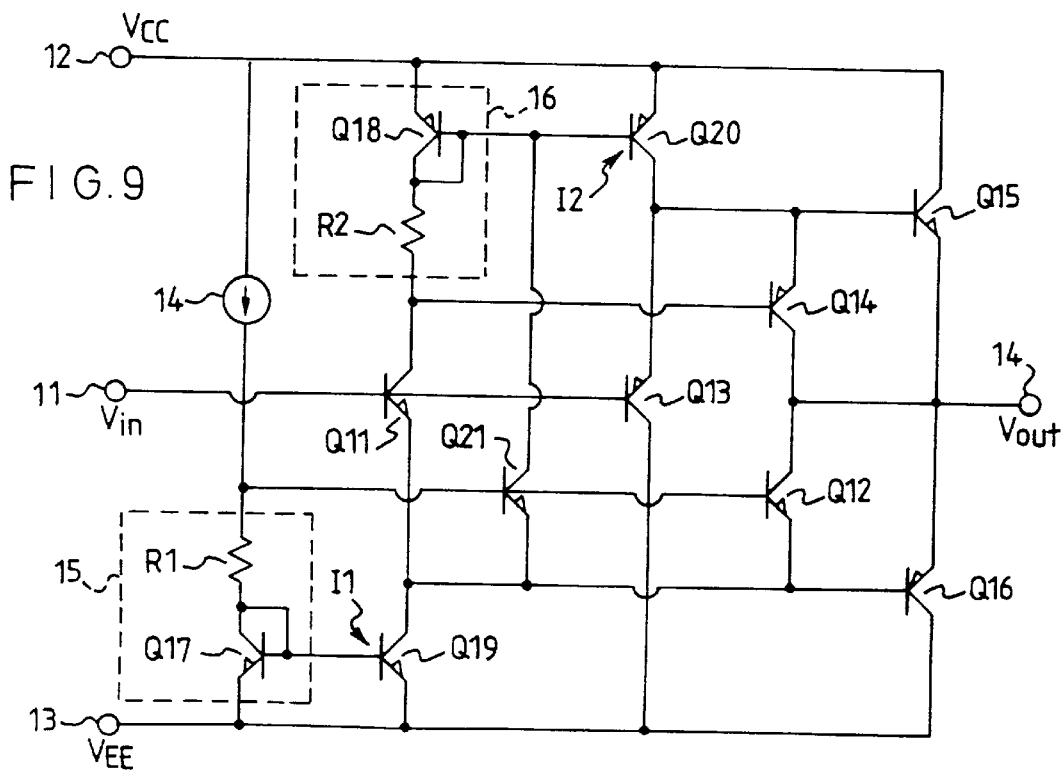
FIG. 9 is a block diagram of a buffer circuit according to a fourth embodiment of the present invention.

Compared with the buffer circuit according to the second embodiment, the buffer circuit shown in FIG. 9 is characterized by replacing the third constant current source $I_3$ in FIG. 7 with a fourth constant current source $I_4$, which is directly connected to the first power supply node 12.

The configuration of the buffer circuit according to this embodiment will be explained in detail.

All of the first, second, fifth, seventh, ninth, and eleventh transistors are npn-bipolar transistors, and all of the third, fourth, sixth, eighth, and tenth transistors are pnp-bipolar transistors.

The first and second transistors Q11 and Q12 form the first differential amplifier. A base, collector, and emitter of the first transistor Q11 are connected to the input node 11, one node of the second resistor $R_2$ constituting the second reference level generator 16, and a collector of the ninth transistor Q19 constituting the first constant current source $I_1$, respectively. An emitter of the ninth transistor Q19 is connected to the second power supply node 13 whose level is the ground level.

A base, collector, and emitter of the second transistor Q12 are connected to the one node of the first resistor $R_1$ constituting the first reference level generator 15, the output node 14, and the collector of the ninth transistor Q19, respectively. The other node of the first resistor $R_1$ is connected to a base and collector of the seventh transistor Q17. An emitter and the base of the seventh transistor are connected to the second power supply node 13 and the base of the ninth transistor Q19, respectively.

The third and fourth transistor Q13 and Q14 form the second differential amplifier. A base, collector, and emitter of the third transistor Q13 are connected to the input node 11, the second power supply node 13, and the collector of a tenth transistor Q20 constituting the second constant current source $I_2$, respectively.

The base, collector, and emitter of the fourth transistor Q14 are connected to one node of the second resistor $R_2$, the output node 14, and the collector of the tenth transistor Q20, respectively. The other node of the resistor $R_2$ is connected to a base and collector of the eighth transistor Q18. The emitter and the base of the eighth transistor Q18 are connected to the first power supply node 12 and a base of the tenth transistor Q20, respectively.

The fourth constant current source $I_4$ is connected between the first power supply node and one node of the first resistor $R_1$. A base, collector, and emitter of the fifth transistor Q15 are connected to the emitters of the third and fourth transistors Q13 and Q14, the first power supply node 12, and the output node 14, respectively. A base, collector, and emitter of the sixth transistor Q16 are connected to the emitters of the first and second transistors Q11 and Q12, the second power supply node 13, and the output node 14, respectively.

A base, collector, and emitter of the eleventh transistor Q21 are connected to the one node of the first resistor $R_1$ constituting the first reference level generator 15, the bases of the eighth and tenth transistors Q18 and Q20, and the collector of the ninth transistor Q19, respectively.

The eleventh transistor Q21 is provided to drive the eighth and tenth transistors Q18 and Q20 even if the first transistor Q11 is in a non-conductive state. Namely, the third and tenth transistors Q13 and Q20 are in a conductive state because the eleventh transistor Q21 is in a conductive state, even if the first transistor Q11 is in a non-conductive state.

An emitter of the tenth transistor Q20 is connected to the first power supply node 12.

In the above mentioned buffer circuit, when constant current generated by the fourth constant current source is $I_4$, resistances of the first and second resistors are $R_1$ and $R_2$, voltages across the base and emitter of the transistors Q17 and Q18 is $V_{BE}$, and voltages applied to the base of the second and fourth transistors Q12 and Q14 are $V_{BE}+I_4 \times R_1$ and $V_{CC}-(V_{BE}+I_4 \times R_2)$, respectively, $V_1$ and $V_2$ are represented as follows.

$$V_1 = V_{BE} + I_4 \times R_1$$

$$V_2 = V_{BE} + I_4 \times R_2$$

The first resistor $R_1$ is provided to prevent the first constant current source, or ninth transistor Q19, from saturating, and the second resistor $R_2$ is provided to prevent the second constant current source, or tenth transistor Q20, from saturating.

In this embodiment, the fourth constant current source $I_4$ is provided to drive the first reference level generator 15. Further, the first and second constant current sources $I_1$ and $I_2$, and the second reference level generator 16 are driven by the fourth constant current source $I_4$.

With this configuration, the buffer circuit can be operable at a low power supply voltage, and the dynamic range of the input and output signals are equal to the supply voltage. Moreover, if the reference levels by the reference level generators 15 and 16 vary, the dynamic range of the output signal varies in accordance with the reference levels. Namely, the amplitude of the swing of the output signal may be selected to be an arbitrary value. When the level of the first power supply node 12 is $V_{CC}$ and the level of the second power supply node 13 is zero (0V), the widest dynamic range ($|V_{CC}|$) is available with $V_1$ and $V_2$ being $V_{BE}$, and the narrowest dynamic range (0) is available with $V_1$ and $V_2$ being $(V_{CC}/2)+V_{BE}$.

Next, the fifth embodiment of the present invention will be explained with reference to FIG. 10.

Figure 10:
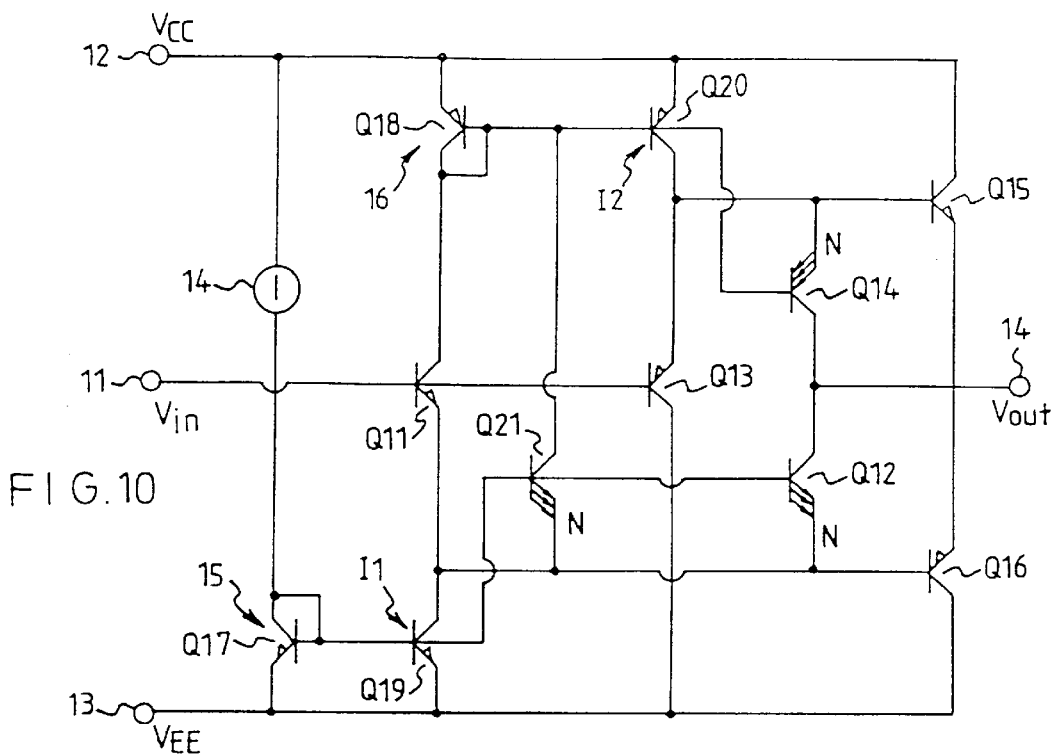
FIG. 10 is a block diagram of a buffer circuit according to a fifth embodiment of the present invention.

Compared with the buffer circuit according to the second embodiment, the buffer circuit shown in FIG. 10 is characterized by replacing the third constant current source $I_3$ in FIG. 8 with the fourth constant current source $I_4$, which is directly connected to the first power supply node 12.

The configuration of the buffer circuit according to this embodiment will be explained in detail.

All of the first, second, fifth, seventh, ninth, and eleventh transistors are npn-bipolar transistors, and all of the third, fourth, sixth, eighth, and tenth transistors are pnp-bipolar transistors.

The first and second transistors Q11 and Q12 form the first differential amplifier. A base, collector, and emitter of the first transistor Q11 are connected to the input node 11, a collector of the eighth transistor Q18 constituting the second reference level generator 16, and a collector of the ninth transistor Q19 constituting the first constant current source $I_1$, respectively. An emitter of the ninth transistor Q19 is connected to the second power supply node 13 whose level is the ground level.

A base, collector, and emitter of the second transistor Q12 are connected to a base and collector of the seventh transistor Q17 constituting the first reference level generator 15, the output node 14, and the collector of the ninth transistor Q19, respectively. The emitter and the base of the seventh transistor are connected to the second power supply node 13 and a base of the ninth transistor Q19, respectively.

The third and fourth transistors Q13 and Q14 form the second differential amplifier. A base, collector, and emitter of the third transistor Q13 are connected to the input node 11, the second power supply node 13, and the collector of the tenth transistor Q20 constituting the second constant current source, respectively.

A base, collector, and emitter of the fourth transistor Q14 are connected to a base and collector of the eighth transistor Q18 constituting the second reference level generator 16, the output node 14, and the collector of the tenth transistor Q20, respectively. The emitter and the base of the eighth transistor Q18 are connected to the first power supply node 12 and a base of the tenth transistor Q20, respectively.

The fourth constant current source $I_4$ is connected between the first power supply node and the collector of the seventh transistor Q17. A base, collector, and emitter of the fifth transistor Q15 are connected to the emitters of the third and fourth transistors Q13 and Q14, the second power supply node 12, and the output node 14, respectively. A base, collector, and emitter of the sixth transistor Q16 are connected to the emitters of the first and second transistors Q11 and Q12, the second power supply node 13, and the output node 14, respectively.

A base, collector, and emitter of the eleventh transistor Q21 are connected to the base of the seventh transistor Q17, the bases of the eighth and tenth transistors Q18 and Q20, and the collector of the ninth transistor Q19, respectively.

An emitter of the tenth transistor Q20 is connected to the first power supply node 12.

The eleventh transistor Q21 is provided to drive the tenth transistor Q20 even if the first transistor Q11 is in a non-conductive state. Namely, the third and tenth transistors Q13 and Q20 are in a conductive state because the eleventh transistor Q21 is in a conductive state, even if the first transistor Q11 is in a non-conductive state.

In the above mentioned buffer circuit, when constant current generated by the fourth constant current source is $I_4$, voltages across the base and emitter of the transistors Q17 and Q18 are $V_{BE}$, and voltages applied to the base of the second and fourth transistors Q12 and Q14 are $V_{BE}$ and $V_{CC}-V_{BE}$, respectively, $V_1$ and $V_2$ are represented as follows.

$V_1=V_{BE}$ $V_2=V_{BE}$

Therefore, the dynamic range of the output signal Vout is equal to $|V_{CC}|$.

Each emitter area of the second and eleventh transistors Q12 and 021 is N-times larger than that of the ninth transistor Q19 to prevent the first constant current source $I_1$, or the ninth transistor Q19, from saturating. An emitter area of the fourth transistor Q14 is N-times larger than that of the tenth transistor Q20 to prevent the second constant current source $I_2$, or the tenth transistor Q20, from saturating. For example, when a number "N" is 4, the voltage across the base and the emitter of the second transistor Q12 ($V_{BE(Q12)}$) is lower than that of the ninth transistor Q19 ($V_{BE(Q19)}$) by 36 mV. When a number "N" is 8, $V_{BE(Q12)}$ is lower than $V_{BE(Q19)}$ by 54 mV. Namely, the threshold voltages of the second, fourth, and eleventh transistors Q12, Q14, and Q21 are lower than those of the ninth and tenth transistors Q19 and Q20.

In this embodiment, the fourth constant current-source $I_4$ is provided to drive the first and second reference level generators 15 and 16. Further, the first and second constant current sources $I_1$ and $I_2$ are driven by the fourth constant current source $I_4$.

With this configuration, the buffer circuit can be operable at a low power supply voltage, and the dynamic range of the input and output signals are equal to the supply voltage. Moreover, if the reference levels generated by the reference level generators 15 and 16 vary, the dynamic range of the output signal varies in accordance with the reference levels. Namely, the amplitude of the swing of the output signal may be selected to an arbitrary value. When the level of the first power supply node 12 is $V_{CC}$ and the level of the second power supply node 13 is zero (0V), the widest dynamic range ($|V_{CC}|$) is available with $V_1$ and $V_2$ being $V_{BE}$, and the narrowest dynamic range (0) is available with $V_1$ and $V_2$ being $(V_{CC}/2)+V_{BE}$.

Figure 11:
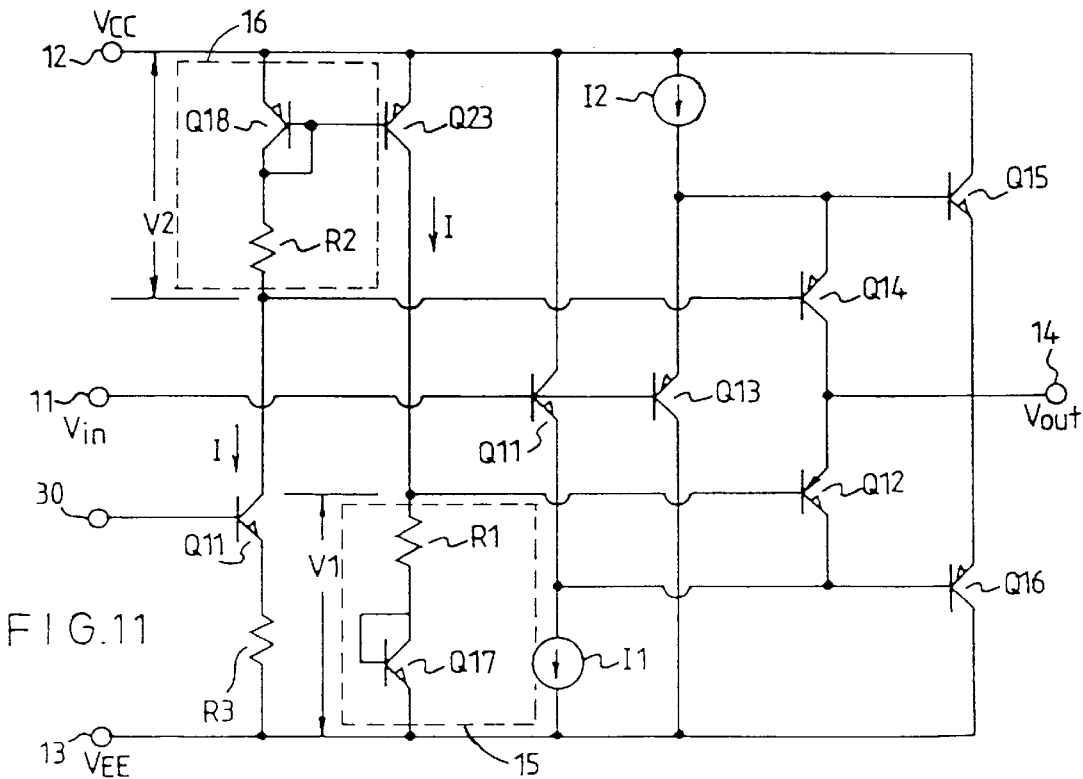
FIG. 11 is a block diagram of a buffer circuit according to a sixth embodiment of the present invention.

Next, the sixth embodiment of the present invention will be explained with reference to FIG. 11.

The buffer circuit according to this embodiment is characterized by providing a control node for receiving a control signal to vary the amplitude of the swing of the output signal.

The configuration of the buffer circuit according to this embodiment will be explained in detail.

All of the first, second, fifth, seventh, and twelfth transistors are npn-bipolar transistors, and all of the third, fourth, sixth, eighth, and thirteenth transistors are pnp-bipolar transistors.

The first and second transistors Q11 and Q12 form the first differential amplifier. A base, collector, and emitter of the first transistor Q11 are connected to the input node 11, the first power supply node 12, and the second power supply node 13 via the first constant current source $I_1$, respectively.

A base, collector, and emitter of the second transistor Q12 are connected to one node of the first resistor $R_1$ constituting the first reference level generator 15, the output node 14, and the second power supply node 13 via the first constant current source $I_1$, respectively. The other node of the resistor $R_1$ is connected to a base and collector of the seventh transistor Q17. An emitter of the seventh transistor Q17 is connected to the second power supply node 13.

The third and fourth transistor Q13 and Q14 form the second differential amplifier. A base, collector, and emitter of the third transistor Q13 are connected to the input node 11, the second power supply node 13, and the first power supply node 12 via the second constant current source $I_2$, respectively.

A base, collector, and emitter of the fourth transistor Q14 are connected to one node of the second resistor $R_2$ constituting the second reference level generator 16, the output node 14, and the first power supply node 12 via the second constant current source $I_2$, respectively. The other node of the resistor $R_2$ is connected to a base and collector of the eighth transistor Q18. An emitter and the base of the eighth transistor Q18 are connected to the first power supply node 12 and a base of the thirteenth transistor Q23, respectively.

The first resistor $R_1$ and the seventh transistor Q17 form the first reference level generator 15 to apply the first reference level $V_1$ across the base of the second transistor Q12 and the second power supply node 13. The second resistor $R_2$ and the eighth transistor Q18 form the second reference level generator 16 to apply the second reference level $V_2$ across the base of the fourth transistor Q14 and the first power supply node 12. The amplitude of the swing of the output signal is determined by the first and second reference levels $V_1$ and $V_2$.

A base, collector, and emitter of the fifth transistor Q15 are connected to the emitters of the third and fourth transistors Q13 and Q14, the first power supply node 12, and the output node 14, respectively. A base, collector, and emitter of the sixth transistor Q16 are connected to the emitters of the first and second transistors Q11 and Q12, the second power supply node 13, and the output node 14, respectively.

A base, collector, and emitter of the twelfth transistor Q22 are connected to the control node 30, the one node of the second resistor $R_2$, and the second power supply node 13 via a third resistor $R_3$, respectively. The twelfth transistor Q22 forms a controllable current source.

The base, collector, and emitter of the thirteenth transistor Q23 are connected to the base to the eighth transistor Q18, the one node of the first resistor $R_1$, and the first power supply node 12, respectively. The eighth and thirteenth transistors Q18 and Q23 form a current mirror circuit.

With this configuration, the level of the control signal applied to the control node 30 is varied to vary the amount of current flowing through the controllable current source, or the twelfth transistor Q22. Namely, suppose that current flowing through the controllable current source is $I_{var}$, the voltages across the base and emitter of the transistors Q17 and Q18 are $V_{BE}$, and voltages applied to the base of the second and fourth transistors Q12 and Q14 are $V_{BE}+I_{var}\times R_1$ and $V_{CC}-(V_{BE}+I_{var}\times R_2)$, respectively. Namely, $V_1$ and $V_2$ are represented as follows.

$$V_1 = V_{BE} + I_{var} \times R_1$$

$$V_2 = V_{BE} + I_{var} \times R_2$$

From the equations (3) and (4), $V_{out(min)}$, $V_{out(max)}$ have already been known.

$$V_{out(min)} = V_1 - V_{BE} \quad (3)$$

$$V_{out(max)} = V_{CC} - V_2 + V_{BE} \quad (4)$$

Therefore, $V_{out(min)}$ and $V_{out(max)}$ are represented as follows.

$$V_{out(min)} = V_{BE} + I_{var} \times R_1 - V_{BE} = I_{var} \times R_1$$

$$V_{out(max)} = V_{CC} - (V_{BE} + I_{var} \times R_2) + V_{BE} = V_{CC} - I_{var} \times R_2$$

It is apparent from these equations that the dynamic range of the output signal is controlled by the control signal applied to the control node 30. Consequently, the amplitude of the output signal is easily controlled in digital signal processing, and muting is also achieved easily.

According to the present invention, the buffer circuit can be operable at a low power supply voltage, and the dynamic range of the input and output signals is equal to the supply voltage. When the level of the first power supply node 12 is $V_{CC}$ and the level of the second power supply node 13 is zero (0V), the widest dynamic range ($|V_{CC}|$) is available with $V_1$ and $V_2$ being $V_{BE}$, and the narrowest dynamic range (0) is available with $V_1$ and $V_2$ being $(V_{CC}/2)+V_{BE}$. Thus, the problems in the conventional buffer circuit are overcome.

Moreover, if the reference levels generated by the reference level generators 15 and 16 are varied, the dynamic range of the output signal is varied in accordance with the reference levels. Namely, the amplitude of the swing of the output signal may be selected to be an arbitrary value by the control signal applied to the control node 30.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A buffer circuit comprising:
    a first transistor having a first base, a first collector, and a first emitter, the first base being coupled to an input node and the first collector being coupled to a first power supply node;
    a second transistor having a second base, a second collector, and a second emitter, the second base being coupled to a first reference level generator, and the second collector being coupled to an output node, the first and second transistors constituting a first differential amplifier;

a third transistor having a third base, a third collector, and a third emitter, the third base being coupled to the input node and the third collector being coupled to a second power supply node;

a fourth transistor having a fourth base, a fourth collector, and a fourth emitter, the fourth base being coupled to a second reference level generator, the fourth collector being coupled to the output node, and the fourth emitter being coupled to the third emitter, the third and fourth transistors constituting a second differential amplifier;

a first constant current source coupled between the first and second emitters and the second power supply node;

a second constant current source coupled between the third and fourth emitters and the first power supply node;

a fifth transistor having a fifth base, a fifth collector, and a fifth emitter, the fifth base being coupled to the third and fourth emitters, the fifth collector being coupled to the first power supply node, and the fifth emitter being coupled to the output node; and a sixth transistor having a sixth base, a sixth collector, and a sixth emitter, the sixth base being coupled to the first and second emitters, the sixth collector being coupled to the second power supply node, and the sixth emitter being coupled to the output node, and further comprising a third current source, wherein the first reference level generator includes a first resistor and a seventh transistor coupled in series between the second base and the second power supply node;

the second reference level generator includes a second resistor and an eighth transistor coupled in series between the fourth base and the first power supply node;

the first current source includes a ninth transistor, wherein the ninth transistor and the seventh transistor form a first current mirror circuit;

the second current source includes a tenth transistor, wherein the tenth transistor and the eighth transistor form a second current mirror circuit; and the third current source is coupled between the first and second resistors.

2. A buffer circuit comprising:

a first transistor having a first base, a first collector, and a first emitter, the first base being coupled to an input node and the first collector being coupled to a first power supply node;

a second transistor having a second base, a second collector, and a second emitter, the second base being coupled to a first reference level generator, and the second collector being coupled to an output node, the first and second transistors constituting a first differential amplifier;

a third transistor having a third base, a third collector, and a third emitter, the third base being coupled to the input node and the third collector being coupled to a second power supply node;

a fourth transistor having a fourth base, a fourth collector, and a fourth emitter, the fourth base being coupled to a second reference level generator, the fourth collector being coupled to the output node, and the fourth emitter being coupled to the third emitter, the third and fourth transistors constituting a second differential amplifier;

a first constant current source coupled between the first and second emitters and the second power supply node;

a second constant current source coupled between the third and fourth emitters and the first power supply node;

a fifth transistor having a fifth base, a fifth collector, and a fifth emitter, the fifth base being coupled to the third and fourth emitters, the fifth collector being coupled to the first power supply node, and the fifth emitter being coupled to the output node; and a sixth transistor having a sixth base, a sixth collector, and a sixth emitter, the sixth base being coupled to the first and second emitters, the sixth collector being coupled to the second power supply node, and the sixth emitter being coupled to the output node, and further comprising a third current source, wherein the first reference level generator includes a seventh transistor having a seventh base, a seventh emitter, and a seventh collector, the seventh base and the seventh collector being coupled to the second base, and the seventh emitter being coupled to the second power supply node;

the second reference level generator includes an eighth transistor having an eighth base, an eighth emitter, and an eighth collector, the eighth base and the eighth collector being coupled to the fourth base, and the eighth emitter being coupled to the first power supply node;

the first current source includes a ninth transistor having a ninth base, a ninth emitter, and a ninth collector, the ninth transistor and the seventh transistor forming a first current mirror circuit;

the second current source includes a tenth transistor having a tenth base, a tenth emitter, and a tenth collector, the tenth transistor and the eighth transistor forming a second current mirror circuit;

a threshold voltage of the second transistor is lower than that of the ninth transistor;

a threshold voltage of the fourth transistor is lower than that of the tenth transistor; and the third current source is coupled between the seventh collector and the eighth collector.

3. The buffer circuit according to claim 2, wherein an area of the second emitter is larger than an area of the ninth emitter; and an area of the fourth emitter is larger than an area of the tenth emitter.

4. A buffer circuit comprising:

a first transistor having a first base, a first collector, and a first emitter, the first base being coupled to an input node and the first collector being coupled to a first power supply node;

a second transistor having a second base, a second collector, and a second emitter, the second base being coupled to a first reference level generator, and the second collector being coupled to an output node, the first and second transistors constituting a first differential amplifier;

a third transistor having a third base, a third collector, and a third emitter, the third base being coupled to the input node and the third collector being coupled to a second power supply node;

a fourth transistor having a fourth base, a fourth collector, and a fourth emitter, the fourth base being coupled to a second reference level generator, the fourth collector being coupled to the output node, and the fourth emitter being coupled to the third emitter, the third and fourth transistors constituting a second differential amplifier;

a first constant current source coupled between the first and second emitters and the second power supply node;

a second constant current source coupled between the third and fourth emitters and the first power supply node;

a fifth transistor having a fifth base, a fifth collector, and a fifth emitter, the fifth base being coupled to the third and fourth emitters, the fifth collector being coupled to the first power supply node, and the fifth emitter being coupled to the output node;

a sixth transistor having a sixth base, a sixth collector, and a sixth emitter, the sixth base being coupled to the first and second emitters, the sixth collector being coupled to the second power supply node, and the sixth emitter being coupled to the output node, and further comprising a third current source;

a third current source; and an eleventh transistor having an eleventh base, an eleventh emitter, and an eleventh collector, wherein the first reference level generator includes a first resistor and a seventh transistor coupled in series between the second base and the second power supply node;

the second reference level generator includes a second resistor and an eighth transistor coupled in series between the fourth base and the first power supply node;

the first current source includes a ninth transistor, and the ninth transistor and the seventh transistor form a first current mirror circuit;

the second current source includes a tenth transistor, and the tenth transistor and the eighth transistor form a second current mirror circuit;

the first collector is coupled to the first power supply node via the second reference level generator;

the third current source is coupled between the first power supply node and the first reference level generator; and the eleventh base being coupled to the first reference level generator, the eleventh collector being coupled to the eighth and tenth bases, and the eleventh emitter being coupled to the ninth collector.

5. A buffer circuit comprising:

a first transistor having a first base, a first collector, and a first emitter, the first base being coupled to an input node and the first collector being coupled to a first power supply node;

a second transistor having a second base, a second collector, and a second emitter, the second base being coupled to a first reference level generator, and the second collector being coupled to an output node, the first and second transistors constituting a first differential amplifier;

a third transistor having a third base, a third collector, and a third emitter, the third base being coupled to the input node and the third collector being coupled to a second power supply node;

a fourth transistor having a fourth base, a fourth collector, and a fourth emitter, the fourth base being coupled to a second reference level generator, the fourth collector being coupled to the output node, and the fourth emitter being coupled to the third emitter, the third and fourth transistors constituting a second differential amplifier;

a first constant current source coupled between the first and second emitters and the second power supply node;

a second constant current source coupled between the third and fourth emitters and the first power supply node;

a fifth transistor having a fifth base, a fifth collector, and a fifth emitter, the fifth base being coupled to the third and fourth emitters, the fifth collector being coupled to the first power supply node, and the fifth emitter being coupled to the output node;

a sixth transistor having a sixth base, a sixth collector, and a sixth emitter, the sixth base being coupled to the first and second emitters, the sixth collector being coupled to the second power supply node, and the sixth emitter being coupled to the output node, and further comprising a third current source; and a third current source and an eleventh transistor having an eleventh base, an eleventh emitter, and an eleventh collector, wherein:

the first reference level generator includes a seventh transistor having a seventh base, a seventh emitter, and a seventh collector, the seventh base and the seventh collector being coupled to the second base, and the seventh emitter being coupled to the second power supply node;

the second reference level generator includes an eighth transistor having an eighth base, an eighth emitter, and an eighth collector, the eighth base and the eighth collector being coupled to the fourth base, and the eighth emitter being coupled to the first power supply node;

the first current source includes a ninth transistor having a ninth base, a ninth emitter, and a ninth collector, the ninth transistor and the seventh transistor forming a first current mirror circuit;

the second current source includes a tenth transistor having a tenth base, a tenth emitter, and a tenth collector, the tenth transistor and the eighth transistor forming a second current mirror circuit;

the first collector being coupled to the first power supply node via the second reference level generator;

the third current source being coupled between the first power supply node and the first reference level generator;

the eleventh base being coupled to the first reference level generator, the eleventh collector being coupled to the eighth base and the tenth base, and the eleventh emitter being coupled to the ninth collector;

a threshold voltage of the second transistor and the eleventh transistor being lower than that of the ninth transistor; and a threshold voltage of the fourth transistor being lower than that of the tenth transistor.

6. The buffer circuit according to claim 5, wherein:

an area of the second emitter and the eleventh emitter is larger than an area of the ninth emitter; and an area of the fourth emitter is larger than an area of the tenth emitter.

7. A buffer circuit comprising:

a first transistor having a first base, a first collector, and a first emitter, the first base being coupled to an input node and the first collector being coupled to a first power supply node;

a second transistor having a second base, a second collector, and a second emitter, the second base being coupled to a first reference level generator, and the second collector being coupled to an output node, the first and second transistors constituting a first differential amplifier;

a third transistor having a third base, a third collector, and a third emitter, the third base being coupled to the input node and the third collector being coupled to a second power supply node;

a fourth transistor having a fourth base, a fourth collector, and a fourth emitter, the fourth base being coupled to a second reference level generator, the fourth collector being coupled to the output node, and the fourth emitter being coupled to the third emitter, the third and fourth transistors constituting a second differential amplifier;

a first constant current source coupled between the first and second emitters and the second power supply node;

a second constant current source coupled between the third and fourth emitters and the first power supply node;

a fifth transistor having a fifth base, a fifth collector, and a fifth emitter, the fifth base being coupled to the third and fourth emitters, the fifth collector being coupled to the first power supply node, and the fifth emitter being coupled to the output node;

a sixth transistor having a sixth base, a sixth collector, and a sixth emitter, the sixth base being coupled to the first and second emitters, the sixth collector being coupled to the second power supply node, and the sixth emitter being coupled to the output node, and further comprising a third current source; and a variable current source and a ninth transistor, wherein:

the first reference level generator includes a first resistor and a seventh transistor coupled in series between the second base and the second power supply node;

the second reference level generator includes a second resistor and an eighth transistor coupled in series between the fourth base and the first power supply node;

the variable current source is coupled to the second reference level generator for driving the second reference level generator;

the ninth transistor and the eighth transistor form a current mirror circuit; and the ninth transistor is coupled to the first reference level generator for driving the first reference level generator by the variable current source.

8. The buffer circuit according to claim 7, wherein the variable current source includes a tenth transistor having a base coupled to a control node, and a variable current is controlled by a control signal applied to the control node.

\* \* \* \* \*